US006445015B1

(12) United States Patent
Braddock

(10) Patent No.: US 6,445,015 B1
(45) Date of Patent: Sep. 3, 2002

(54) METAL SULFIDE SEMICONDUCTOR TRANSISTOR DEVICES

(75) Inventor: Walter David Braddock, Rochester, MN (US)

(73) Assignee: Osemi, Incorporated, Rochester, MN (US)

(*) Notice: Subject to any disclaimer, the term of this patent is extended or adjusted under 35 U.S.C. 154(b) by 0 days.

(21) Appl. No.: 09/638,130

(22) Filed: Aug. 11, 2000

Related U.S. Application Data

(60) Provisional application No. 60/201,739, filed on May 4, 2000.

(51) Int. Cl.[7] .......................... H01L 31/072; H01L 29/76

(52) U.S. Cl. ......................... 257/192; 257/412; 257/406; 257/410; 257/411

(58) Field of Search .................................. 257/192, 194, 257/406, 410, 411, 412, 631

(56) References Cited

U.S. PATENT DOCUMENTS

| | | | | |
|---|---|---|---|---|
| 4,416,952 | A | 11/1983 | Nishizawa | 428/698 |
| 4,561,915 | A | 12/1985 | Mito | 148/171 |
| 4,745,082 | A | 5/1988 | Kwok | 437/39 |
| 4,802,180 | A | 1/1989 | Brandle, Jr. et al. | 372/41 |
| 4,843,450 | A | 6/1989 | Kirchner et al. | 257/38 |
| 4,859,253 | A | 8/1989 | Buchanan et al. | 148/33 |
| 4,935,789 | A | 6/1990 | Calviello | 357/22 |
| 5,124,762 | A | 6/1992 | Childs et al. | 357/16 |
| 5,451,548 | A | 9/1995 | Hunt et al. | 437/225 |

(List continued on next page.)

FOREIGN PATENT DOCUMENTS

JP 8085873 A 4/1998

OTHER PUBLICATIONS

Passlack et. al., "Thermodynamic and photochemical stability of low interface state density $Ga_2O_3$–GaAs structures fabricated by in–situ molecular beam epitaxy", Applied Physics Letters, vol. 69, No. 3, pp. 302–304, Jul. 15, 1996.

(List continued on next page.)

*Primary Examiner*—Minh Loan Tran
(74) *Attorney, Agent, or Firm*—Neifeld IP Law, PC

(57) ABSTRACT

A self-aligned enhancement mode metal-sulfide-compound semiconductor field effect transistor (10) includes a lower sulfide layer that is a mixture of $Ga_2S$, $Ga_2S_3$, and other gallium sulfide compounds (30), and a second insulating layer that is positioned immediately on top of the gallium sulphur layer together positioned on upper surface (14) of a III–V compound semiconductor wafer structure (13). Together the lower gallium sulfide compound layer and the second insulating layer form a gallium sulfide gate insulating structure. The gallium sulfide gate insulating structure and underlying compound semiconductor gallium arsenide layer (15) meet at an atomically abrupt interface at the surface of with the compound semiconductor wafer structure (14). The initial essentially gallium sulphur layer serves to passivate and protect the underlying compound semiconductor surface from the second insulating sulfide layer. A refractory metal gate electrode layer (17) is positioned on upper surface (18) of the second insulating sulfide layer. The refractory metal is stable on the second insulating sulfide layer at elevated temperature. Self-aligned source and drain areas, and source and drain contacts (19, 20) are positioned on the source and drain areas (21, 22) of the device. Multiple devices are then positioned in proximity and the appropriate interconnection metal layers and insulators are utilized in concert with other passive circuit elements to form a integrated circuit structure.

44 Claims, 2 Drawing Sheets

10

33 17 18 26 32 31 26 30 19 14 20 15 23 24 25 11 13 12 21 22

U.S. PATENT DOCUMENTS

| | | | | | |
|---|---|---|---|---|---|
| 5,550,089 | A | | 8/1996 | Dutta et al. | 437/225 |
| 5,597,768 | A | | 1/1997 | Passlack et al. | 437/236 |
| 5,665,658 | A | | 9/1997 | Passlack | 438/763 |
| 5,693,565 | A | | 12/1997 | Camilletti et al. | 357/22 |
| 5,767,388 | A | | 6/1998 | Fleischer et al. | 73/31 |
| 5,821,171 | A | | 10/1998 | Hong et al. | 438/767 |
| 5,930,611 | A | * | 7/1999 | Okamoto | 257/410 |
| 5,945,718 | A | | 8/1999 | Passlack et al. | 257/410 |
| 6,006,582 | A | | 12/1999 | Bhandari et al. | 73/232 |
| 6,030,453 | A | | 2/2000 | Passlack et al. | 117/104 |
| 6,071,780 | A | * | 6/2000 | Okamoto et al. | 257/410 |
| 6,094,295 | A | | 7/2000 | Passlack et al. | 359/321 |
| 6,150,677 | A | | 12/2000 | Tanaka et al. | 257/201 |
| 6,207,976 | B1 | | 3/2001 | Takahashi et al. | 257/192 |
| 6,313,511 | B1 | | 11/2001 | Noguchi | 257/392 |

OTHER PUBLICATIONS

Passlack et. al., "Recombination velocity at oxide–GaAs interfaces fabricated by in–situ molecular beam epitaxy", Applied Physics Letters, vol. 68, No. 25, pp. 3605–3607, Jun. 17, 1997.

Passlack et. al. "Quasistatic and high frequency capacitance–vltage characterization of $Ga_2O_3$–GaAs structures fabricated by in–situ molecular beam epitaxy", Applied Physics Letters, vol. 68, No. 8, pp. 1099–1101, Feb. 19, 1996.

Ueda et. al. "Anisotropy of electrical and optical propeties in B–$Ga_2O_3$ single crystals", Applied Physics Letters, vol. 71, No. 7, pp. 933–935, Aug. 18, 1997.

Ueda et. al. "Synthesis and control of conductivity of ultraviolet transmitting B–Ga2O3 single crystals", Applied Physics Letters, vol. 70, No. 26, pp. 3561–3563, Jun. 30, 1997.

U.S. patent application Ser. No. 09/632,650, pending.

U.S. patent application Ser. No. 09/636,484, pending.

U.S. patent application Ser. No. 09/638,130, pending.

U.S. patent application Ser. No. 09/638,384, pending.

* cited by examiner

METAL SULFIDE SEMICONDUCTOR TRANSISTOR DEVICES

CROSS-REFERENCE TO RELATED APPLICATIONS

This application claims priority under 35 USC 119(e) to Provisional application number 60/201,739 filed on May 4 2000, listing Walter David Braddock as inventor.

STATEMENT AS TO FEDERALLY SPONSORED RESEARCH

This invention was made with the support of the United States government under US United States may have certain rights in the invention.

BACKGROUND OF THE INVENTION

1. Field of the Invention

The present invention pertains to low power and high speed integrated circuits in the compound semiconductor field utilizing field effect transistors and more specifically complementary field effect transistors used in concert including enhancement mode self-aligned metal-sulfide-compound semiconductor transistors and depletion mode self-aligned metal-sulfide-compound semiconductor transistors and methods of materials growth and fabrication of said structures and the ultra large scale integration of said transistors.

2. Discussion of the Background

The gallium arsenide and indium phosphide integrated circuit industry has been limited without a technology that simultaneously allows the integration of complementary field effect transistor devices and transistors with low gate leakage currents. In contrast to silicon technology that has a very mature and useful complementary metal oxide semiconductor (CMOS) technology. Field effect transistor (FETs) widely used in the III–V semiconductor industry employ metal gates and Schottky gate contacts that are have quiescent-state leakage currents exceeding many microamps. The use of metal gates in compound semiconductor technology further results in individual transistors and integrated circuits that have excessively high power dissipation, reduced transconductance, reduced logic swing and the inability to operate on a single power supply, and generally limited performance characteristics. The high magnitude of the quiescent leakage current limits the maximum integration of GaAs devices to circuits of several hundred thousand transistors for those skilled in the art. In contrast, the simultaneous integration of many millions of transistors is possible at high integration densities using silicon CMOS technology. These ultra high integration densities and levels cannot be obtained using metal, Schottky-style gates that are not insulated in compound semiconductor FETs. Thus Si CMOS technology offers significant advantages in terms of individual gate leakage, circuit integration level and cost.

However when compared to silicon, complementary GaAs and InP circuit technology exhibits faster and more optimized speed/power performance and efficiency at a low supply voltage of IV and below. The market acceptance of these GaAs and InP integrated circuit technologies remains low because of the lack of ability to demonstrate high integration densities with low amounts of operating power. Thus, silicon CMOS dominates the field of digital integrated circuitry and neither GaAs nor InP technologies can successfully penetrate this market.

What is needed are new and improved compound semiconductor field effect transistors (FET). What is also needed are new and improved compound semiconductor FETs using metal-sulfide-semiconductor junctions (MSSFET). What is also needed are new and improved compound semiconductor MSSFETs using a self-aligned gate structure. What is also needed are new and improved self-aligned compound semiconductor MSSFETs using enhancement mode and depletion mode operation. What is also needed are new and improved self-aligned compound semiconductor MSSFETs with stable and reliable device operation. What is also needed are new and improved self-aligned compound semiconductor MSSFETs which enable optimum compound semiconductor device performance. What is also needed are new and improved self-aligned compound semiconductor MSSFETs with optimum efficiency and output power for RF and microwave applications. What is also needed are new and improved self-aligned compound semiconductor MSSFETs for use in complementary circuits and architectures. What is also needed are new and improved self-aligned compound semiconductor MSSFETs for low power/high performance complementary circuits and architectures. What is also needed are new and improved self-aligned compound semiconductor MSSFETs which offer the design flexibility of complementary architectures. What is also needed are new and improved self-aligned compound semiconductor MSSFETs which keep interconnection delays in ultra large scale integration under control. What is needed are new and useful complementary integrated circuits where each individual transistor has a leakage current approaching $10^{-2}$ amp. What is needed is a truly useful integrated circuit technology for GaAs and InP that allows for the useful and economical operation of ULSI digital integrated circuits in compound semiconductors. What is needed are new and improved compound semiconductor MSSFET integrated circuits with very low net power dissapation. What is needed are new and improved compound semiconductor MSSFET devices with low gate leakage currents that may be integrated together to form ultra large scale integrated circuits that include millions of transistors. What is needed are new and improved complementary MSSFET devices and circuits in compound semiconductors that allow the direct use, transfer and application of silicon CMOS design that already exits in the art.

What is also needed are new and improved methods of fabrication of self-aligned compound semiconductor MSSFETs. What is also needed is new and improved methods of fabrication of self-aligned compound semiconductor MSSFETs which are compatible with established complementary GaAs heterostructure FETs technologies. What is also needed are new and improved compound semiconductor MSSFETs which are relatively easy to fabricate and use.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

Figure 1:
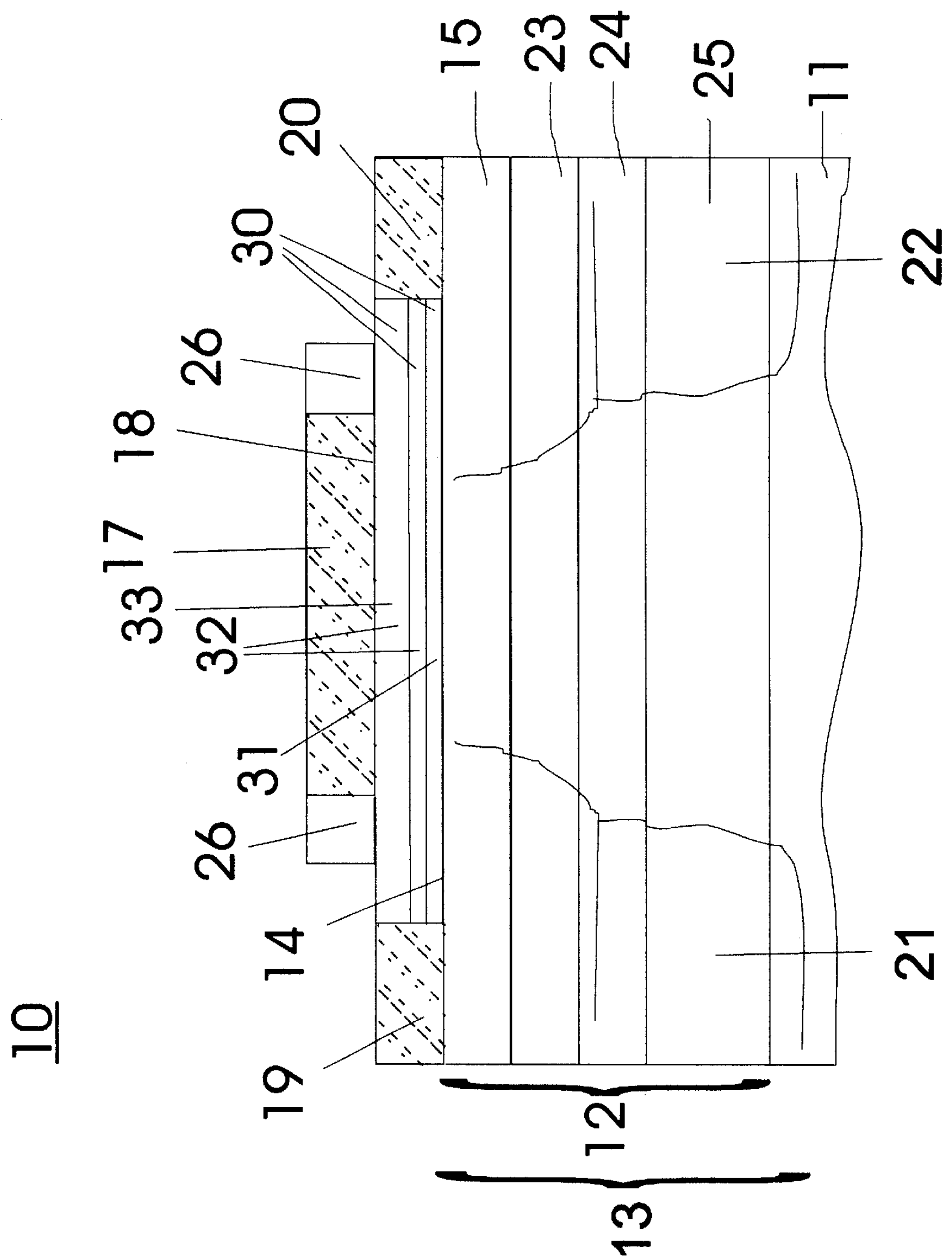
FIG. 1 is simplified cross sectional view of a self-aligned enhancement mode compound semiconductor MSSFET in accordance with a preferred embodiment of the present invention.

The exemplification set out herein illustrates a preferred embodiment of the invention in one form thereof, and such exemplification is not intended to be construed as limiting in any manner.

DETAILED DESCRIPTION OF THE DRAWINGS

The present invention provides, among other things, a self-aligned enhancement mode metal-sulfide-compound semiconductor FET. The FET includes a gallium sulphur insulating structure that is composed of at least two distinct layers. The first layer is most preferably more that 10 angstroms thick but less that 25 angstroms in thickness and composed substantially of gallium sulphur compounds including but not limited to stoichiometric $Ga_2S_3$, GaS, and $Ga_2S$, and possibly a lesser fraction of other gallium sulphur compounds. The upper insulating layer in the gallium sulfide insulating structure is composed of an insulator that does not intermix with the underlying gallium sulphide insulating structure. This upper layer must possess excellent insulating qualities, and is most typically composed of gallium sulphur and a third rare earth element that together form a ternary insulating material. Therefore the entire gallium sulfide rare earth gate insulator structure is composed of at least two layers and may contain a third intermediate graded layers that consists of a mixture of the upper insulating material and the gallium sulphur compounds that compose the initial layer. Together the initial gallium sulphur layer, any intermediate graded layer and the top insulating region form both a gallium sulfide insulating structure and the gate insulator region of a metal-sulfide-compound semiconductor field effect transistor. The initial substantially gallium sulphur layer forms an atomically abrupt interface with the top layer of the compound semiconductor wafer structure, and does not introduce midgap surface states into the compound semiconductor material. A refractory metal gate electrode is preferably positioned on the upper surface of the gate insulator structure layer. The refractory metal is stable on the gate insulator structure layer at elevated temperature. Self-aligned source and drain areas, and source and drain contacts are positioned on the source and drain areas. In all embodiments preferred and otherwise, the metal-sulfide-compound semiconductor transistor includes multi-layer gate insulator structure including an initial gallium sulphur layer, intermediate transition layer, and upper insulating layer of 30-250angstroms in thickness positioned on upper surface of a compound semiconductor heterostructure that form the gate insulator structure. The preferred embodiment also comprises a compound semiconductor heterostructure including a GaAs, $Al_xGa_{1-x}As$ and $In_yGa_{1-Y}As$ layers with or without n-type and/or p-type charge supplying layers which are grown on a compound semiconductor substrate, a refractory metal gate of W, WN, or WSi, self aligned donor (n-channel FET) or acceptor (p-channel FET) implants, and source and drain ohmic contacts. In another preferred embodiment, the compound semiconductor heterostructure comprises an $In_yGa_{1-y}As$,$Al_xIn_{1-x}As$, and InP compound semiconductor heterostructure and n-type and/or p-type charge supplying layers which are grown on an InP substrate, and a refractory metal gate of W, WN, or WSi, self aligned donor (n-channel FET) or acceptor (p-channel FET) implants, and source and drain ohmic contacts.

FIG. 1 is simplified cross sectional view of a self-aligned enhancement mode compound semiconductor MSSFET in accordance with a preferred embodiment of the present invention. Device 10 includes a compound semiconductor material, such as any III–V material employed in any semiconductor device, represented herein by a III–V semiconductor substrate 11 and a compound semiconductor epitaxial layer structure 12. For the purpose of this disclosure, the substrate 11 and any epitaxial layer structure 12 formed thereon will be referred to simply as a compound semiconductor wafer structure which in FIG. 1 is designated 13. Methods of fabricating semiconductor wafer structure 13 include, but are not limited to, molecular beam epitaxy (MBE) and metal organic chemical vapor deposition (MOCVD). It will of course be understood that in some specific applications, there may be no epitaxial layers present and upper surface of top layer 15 may simply be the upper surface of substrate 11.

Device 10 further comprises a gate insulator structures (30) that includes at least two or more layers. The first layer of the gate insulator structure (31) is composed entirely of gallium sulfide compounds and is directly adjacent to and deposited upon the compound semiconductor structure. The second layer of the gate insulator structure (32) is composed of a compound of gallium, sulphur, and one or more rare earth elements from the periodic table. Gate insulator structure (30) may include a third layer (33) consisting of Gallium, Sulphur, and at least one rare earth element. The initial gallium sulphur layer (31) forms an atomically abrupt interface 14 with the upper surface of top layer 15, the top layer of the compound semiconductor structure. A refractory metal gate electrode 17 which is stable in the presence of top insulating material at elevated temperature is positioned on upper surface 18 of the gate insulator structure. Dielectric spacers 26 are positioned to cover the sidewalls of metal gate electrode 17. Source and drain contacts 19 and 20 are deposited on self-aligned source and drain areas 21 and 22, respectively. of a <11 angstrom GaAs top layer (15), a <101 angstrom $Al_xGa_{1-x}As$ spacer layer (23), a <251 angstrom $In_yGa_{1-y}As$ channel layer (24), and a GaAs buffer layer (25) grown on a GaAs substrate (11). Top GaAs layer (15) is used to form an atomically abrupt layer with the gate insulator structure with an abrupt interface with low defect density.

As a simplified example of fabricating a self-aligned enhancement mode compound semiconductor MSSFET in accordance with a preferred embodiment of the present invention, a III–V compound semiconductor wafer structure 13 with an atomically ordered and chemically clean upper surface of top layer 15 is prepared in an ultra-high vacuum semiconductor growth chamber and transferred via a ultra high vacuum transfer chamber to a second ultra high vacuum sulfide and insulator deposition chamber. The initial gallium sulphur layer (31) is deposited on upper compound semiconductor surface layer 15 using thermal evaporation from a high purity $Ga_2S_3$ source or from crystalline gadolinium gallium sulphide, $Ga_3Gd_5S_{12}$. This initial gallium sulphur layer is deposited while holding the substrate temperature of the compound semiconductor structure at <500° C., and most preferably at a substrate temperature <395° C. After the deposition of approximately 18 angstroms of gallium sulphur compounds in the insulator deposition chamber over a 5 to 8 minute period of time, deposition of the second insulator layer is initiated. The deposition of the second insulator layer starts by directing the flux from a low power sulphur plasma source into the ultra high vacuum system such that the sulphur plasma effluent and species are largely directed toward and impinging upon said compound semiconductor structure with initial gallium sulphide layer. The flux from the sulphur plasma source should be directed at the surface for between 2–5 seconds, subsequently followed by the co-evaporation of gallium sulphur compounds from $Ga_2S_3$ and a second thermal evaporation source that contains a rare-earth element. The flux beams from the sulphur source, $Ga_2S_3$ and rare-earth evaporation source thermal evaporation sources are carefully balanced to provide a ternary insulator layer on top of the initial gallium sulphide layer on said compound semiconductor structure. As the deposition of the second ternary insulator layer is initiated, the substrate temperature is simultaneously adjusted to provide an optimized substrate temperature for the deposition of this layer. In this example the substrate temperature required to deposit the gallium+sulphur+rare earth layer is <530° C. The deposition of this second insulator layer proceeds until the total insulator thickness of 200–250 angstroms is achieved. Shutters and valves are utilized to stop the deposition of the ternary gallium+sulphur+rare earth layer upon the deposition of the required thickness of the insulator layer. The substrate temperature is cooled invacuum to <200° C., and the deposition of a refractory metal which is stable and does not interdiffuse with on the top layer of the gate insulator structure at elevated temperature such as WSi or WN is deposited on upper surface 18 of sulfide layer 32 and subsequently patterned using standard lithography. The refractory metal layer is etched until sulfide layer 31 is exposed using a refractory metal etching technique such as a fluorine based dry etching process. The refractory metal etching procedure does not etch the sulfide layer 31, thus, sulfide layer 31 functions as an etch stop layer such that upper surface of top layer 15 remains protected by sulfide layer 31. All processing steps are performed using low damage plasma processing. Self-aligned source and drain areas 21 and 22, respectively are realized by ion implantation of Si (n-channel device) and Be/F or C/F (p-channel device) using the refractory metal gate electrode 17 and the dielectric spacers 26 as implantation masks. Such ion implantation schemes are compatible with standard processing of complementary compound semiconductor heterostructure FET technologies and are well known to those skilled in the art. The implants are activated at 700–900° C. using rapid thermal annealing in an ultra high vacuum environment such that degradation of the interface 16 established between top layer 15 and sulfide layer 31 is completely excluded. Finally, ohmic source and drain contacts 19 and 20 are deposited on the self-aligned source and drain areas 21 and 22, respectively. The devices may then be interconnected using the standard methods to those skilled in the art of integrated microelectronics and integrated circuit manufacture.

Figure 2:
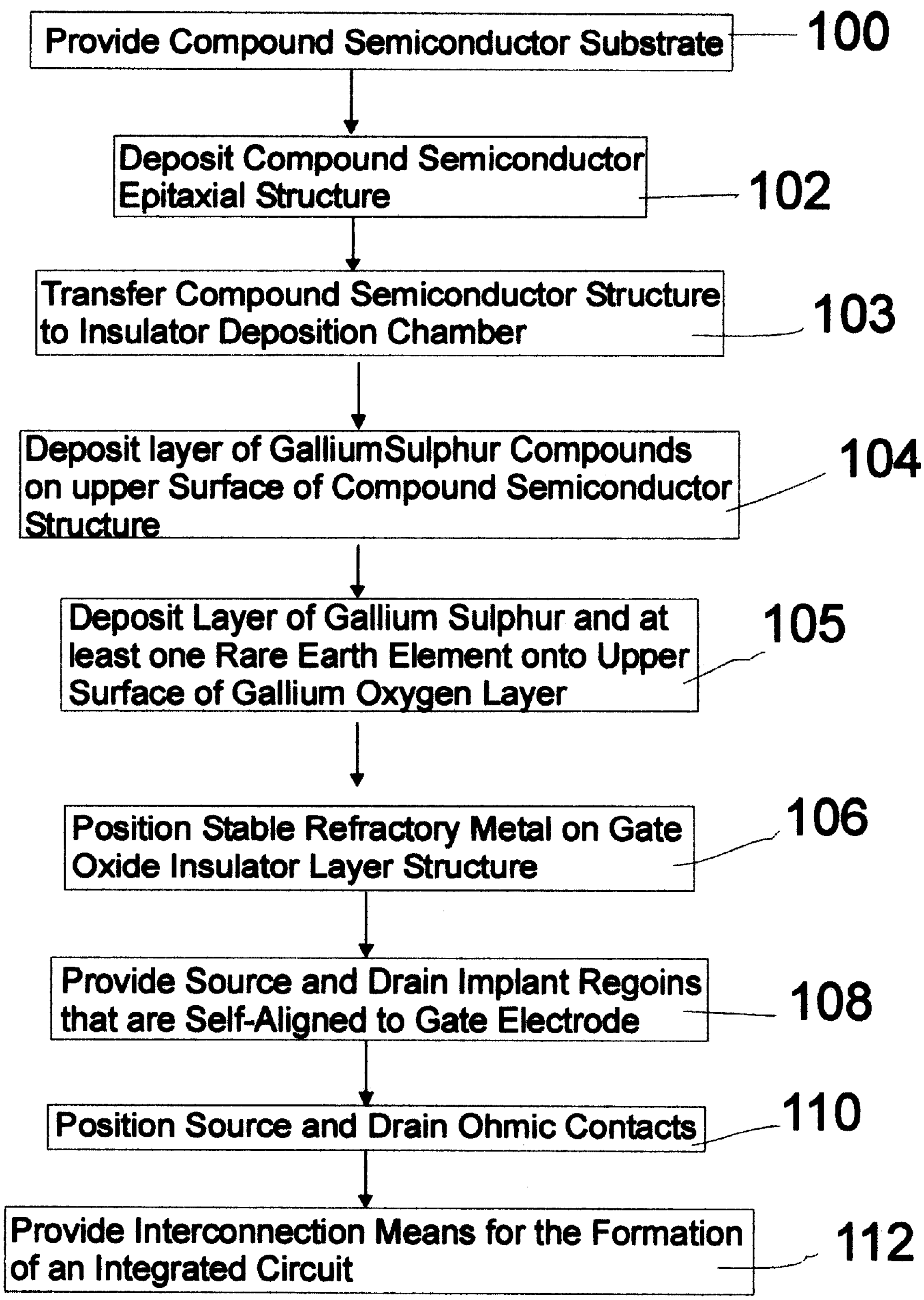
FIG. 2 is a simplified flow chart illustrating a method of manufacturing a self-aligned enhancement mode compound semiconductor MSSFET in accordance with a preferred embodiment of the present invention.

FIG. 2 is a simplified flow chart illustrating a method of manufacturing a self-aligned enhancement mode compound semiconductor MSSFET in accordance with a preferred embodiment of the present invention. In step 102, a compound semiconductor wafer structure is produced using standard epitaxial growth methods in the art. In step 103, a layer consisting of gallium sulphide compounds including but not limited to $Ga_2S_3$, $Ga_2S$,GaS is deposited on upper surface of said compound semiconductor wafer structure. In step 104, an insulating layer of gallium sulphide and one or more rare earth elements is deposited on the upper surface of the initial gallium sulphide compound layer. The gallium sulfide gate insulator structure is formed in steps 104 and 105. In step 106, a stable refractory gate metal is positioned on upper surface of said gate insulator structure. In step 108, source and drain ion implants are provided self-aligned to the gate electrode. In step 110, source and drain ohmic contacts are positioned on ion implanted source and drain areas.

In a preferred embodiment, step 100 provides a compound semiconductor substrate such as GaAs or InP. Step 102 includes the preparation and epitaxial growth of an atomically ordered and chemically clean upper surface of the compound semiconductor wafer structure. Step 103 preferably comprises thermal evaporation from a purified and crystalline gadolinium gallium sulphide or $Ga_2S_3$ source on an atomically ordered and chemically clean upper surface of the compound semiconductor wafer structure. Step 104 comprises the formation of a gallium+sulphide+rare earth elemental insulating layer formed through the simultaneous vacuum evaporation of gallium sulphur species and at least one rare earth element such as Gadolinium with the simultaneous sulphidization using the effluent of an sulphur gas plasma source directed in simultaneous combination with other thermal evaporation sources toward substrate 100. The initial gallium sulphur compound layer of the gate insulator structure preferably functions as an etch stop layer such that the upper surface of the compound semiconductor wafer structure remains protected by the gate sulfide during and after gate metal etching. The refractory gate metal desirably does not react with or diffuse into the gate sulfide layer during high temperature annealing of the self-aligned source and drain ion implants. The quality of the interface formed by the gate sulfide layer and the upper surface of the compound semiconductor structure is desirably preserved during high temperature annealing of the self-aligned source and drain ion implants. The self-aligned source and drain implants are desirably annealed at approximately 700° C. in an ultra high vacuum environment. The self-aligned source and drain implants are desirably realized by positioning dielectric spacers on the sidewalls of the refractory gate metal.

Thus, new and improved compound semiconductor devices and methods of fabrication are disclosed. The new and improved self-aligned enhancement mode metal-sulfide-compound semiconductor heterostructure field effect transistors enable stable and reliable device operation, provide optimum compound semiconductor device performance for low power/high performance complementary circuits and architectures, keep interconnection delay in ULSI under control, and provide optimum efficiency and output power for RF and microwave applications as well as for digital integrated circuits that require very high integration densities.

These improvements essentially solve or overcome the problems of the prior art, such as high gate leakage in compound semiconductor FET devices, low integration densities, dc electrical instability, and electrical hysterisis, and therefore provide a highly useful invention. While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention. What is claimed:

What is claimed is:

1. An enhancement mode metal-sulfide-compound semiconductor field effect transistor comprising:

a compound semiconductor wafer structure having an upper surface;

a gate insulator structure adjacent to and on top of said upper surface, said gate insulator structure comprising a first layer and a second layer;

said first layer substantially comprising compounds of gallium and sulphur;

said second layer substantially comprising compounds of gallium, sulphur, and at least one rare earth element;

a gate electrode on said gate insulator structure;

source and drain ion implants self-aligned to said gate electrode; and source and drain ohmic contacts positioned on ion implanted source and drain areas;

wherein said gate electrode comprises a member selected from the group consisting of W, WN, WSi, and combinations thereof.

2. The transistor of claim 1 wherein said first layer forms an atomically abrupt interface with said upper surface.

3. The transistor of claim 1 wherein said gate insulator structure further comprises a graded layer that contains varying compositions of gallium, sulphur, and at least one rare-earth element, and a composition of at least one of said gallium, sulphur, and at least one rare-earth element in said graded layer varies monotonically with depth of said graded layer.

4. The transistor of claim 1 wherein said gate insulator structure comprises more than three layers.

5. The transistor of claim 1 wherein said first layer has a thickness of more than 10 angstroms and less than 25 angstroms.

6. The transistor of claim 1 wherein said gate insulator structure has a thickness of 20–300 angstroms.

7. The transistor of claim 1 wherein said first layer forms an interface with the compound semiconductor wafer structure that extend less than four atomic layers in depth of structural interface modulation.

8. The transistor of claim 1 wherein said first layer and said gate insulator structure protects said upper surface.

9. The transistor of claim 1 wherein said gate electrode comprises a refractory metal which is stable in presence of the top layer of said gate insulator structure at 700° C.

10. The transistor of claim 1 wherein said source and drain ion implants define one of an n-channel and a p-channel.

11. The transistor of claim 1 wherein said source and drain ion implants comprise at least one of Be/F and C/F.

12. The transistor of claim 1 wherein said upper surface comprises GaAs.

13. The transistor of claim 1 wherein said upper surface comprises $In_xGa_{1-x}As$.

14. An enhancement mode metal-sulfide-compound semiconductor field effect transistor comprising:

- a compound semiconductor wafer structure having an upper surface;
- a gate insulator structure adjacent to and deposited on said upper surface, said gate insulator structure comprising a first layer, a second layer, and a third layer;
- said first layer substantially comprising compounds of gallium and sulphur;
- said second layer substantially comprising compounds of gallium, sulphur and at least one rare earth element such that the normalized relative composition of at least one of gallium, sulphur, and at least one rare earth element monotonically varies with depth in said second layer;
- said third layer substantially comprising compounds of gallium, sulphur and at least one rare earth element;
- a gate electrode positioned on said upper surface;
- source and drain ion implants self-aligned to said gate electrode; and
- source and drain ohmic contacts positioned on ion implanted source and drain areas;
  - wherein said gate electrode comprises a member selected from the group consisting of W, WN, WSi, and combinations thereof.

15. The transistor of claim 14 wherein said first layer forms an atomically abrupt interface with said upper surface.

16. The transistor of claim 14 wherein said gate insulator structure further comprises a graded layer in which a composition of at least one of said gallium, sulphur, and a rare earth element vary with depth in said layer.

17. The transistor of claim 14 wherein said first layer has a thickness of more than 10 angstroms and less than 25 angstroms.

18. The transistor of claim 14 wherein said gate insulator structure has a thickness of 20–300 angstroms.

19. The transistor of claim 14 wherein said first layer forms an interface with the compound semiconductor structure that extend less than four atomic layers in depth of modulation of said interface.

20. The transistor of claim 14 wherein said first layer and said gate insulator structure protects said upper surface.

21. The transistor of claim 14 wherein said gate electrode comprises a metal which is stable in presence of the top layer of the gate insulator structure at 700° C.

22. The transistor of claim 14 wherein said source and drain ion implants define an n-channel.

23. The transistor of claim 14 wherein said source and drain ion implants comprise at least one of Be/F and C/F.

24. The transistor of claim 14 wherein said upper surface comprises GaAs.

25. The transistor of claim 14 wherein said upper surface comprises $In_xGa_{1-x}As$.

26. An enhancement mode metal-sulfide-compound semiconductor field effect transistor comprising:

- a compound semiconductor wafer structure having an upper surface;
- a multilayer gate insulator structure on said upper surface, said multilayer gate insulator structure including alternating layers each of which comprises gallium, sulphur, and at least one rare-earth element;
- a gate electrode positioned on said multilayer gate insulator structure layer;
- source and drain ion implants self-aligned to said gate electrode;
- source and drain ohmic contacts positioned on ion implanted source and drain areas; and
- dielectric spacers positioned on sidewalls of said gate electrode.

27. An enhancement mode metal-sulfide-compound semiconductor field effect transistor structure comprising:

- a compound semiconductor wafer structure having an upper surface;
- a gate insulator structure adjacent to and on top of said upper surface, said gate insulator structure comprising a first layer and a second layer;
- said first layer substantially comprising compounds of gallium and sulphur;
- said second layer substantially comprising compounds of gallium, sulphur, and at least one rare earth element; and
- a gate electrode on said gate insulator structure.

28. The structure of claim 27 wherein said gate insulator structure further comprises a third layer, said third layer substantially comprising compounds comprising gallium.

29. The structure of claim 28 wherein said compounds comprising gallium further comprise sulfur.

30. The structure of claim 29 wherein said compounds comprising gallium further comprise at least one rare earth element.

31. The structure of claim 29 wherein said gate insulator structure further comprising a fourth layer.

32. The structure of claim 27 wherein said gate insulator structure further comprises a third layer, said third layer substantially comprising compounds of gallium, oxygen, and at least one rare earth in which a composition density of at least one of gallium, oxygen, and at least one rare earth varies monotonically with depth of said third layer.

33. The structure of claim 27 wherein said gate insulator structure has a low electronic midgap defect density.

34. The structure of claim 27 further comprising source and drain ion implants self-aligned to said gate electrode.

35. The structure of claim 27 further comprising source and drain ohmic contacts positioned on ion implanted source and drain areas.

36. The structure of claim 27 wherein said gate electrode comprises a member selected from the group consisting of W, WN, WSi, and combinations thereof.

37. The structure of claim 27 in a monolithic integrated circuit.

38. The structure of claim 27 wherein said first layer is adjacent and in contact with said upper surface.

39. The structure of claim 27 further comprising source and drain contacts.

40. The structure of claim 27 wherein said source and drain contacts are rapid thermal annealed in UHV.

41. The structure of claim 27 wherein said gate insulator structure passivates said upper surface.

42. A method of forming an enhancement mode metal-sulfide-compound semiconductor field effect transistor structure, comprising:

providing a compound semiconductor wafer structure having an upper surface;

depositing a gate insulator structure adjacent to and on top of said upper surface, comprising depositing a first layer and depositing a second layer;

said first layer substantially comprising compounds of gallium and sulphur;

said second layer substantially comprising compounds of gallium, sulphur, and at least one rare earth element; and depositing a gate electrode on said gate insulator structure.

43. The method of claim 42 comprising rapid thermal annealing said structure in UHV.

44. The method of claim 43 wherein said rapid thermal annealing comprising annealing at between 700 and 900 degrees Centigrade.

* * * * *